United States Patent [19]

Wong

[11] Patent Number: 5,230,748
[45] Date of Patent: * Jul. 27, 1993

[54] SUPERCONDUCTOR AND PROCESS OF MANUFACTURE

[75] Inventor: James Wong, Wayland, Mass.

[73] Assignee: Composite Materials Technology, Inc., Shrewsbury, Mass.

[*] Notice: The portion of the term of this patent subsequent to May 15, 2007 has been disclaimed.

[21] Appl. No.: 733,087

[22] Filed: Jul. 19, 1991

Related U.S. Application Data

[63] Continuation-in-part of Ser. No. 628,406, Dec. 17, 1990, Pat. No. 5,174,830, and a continuation-in-part of Ser. No. 586,264, Sep. 21, 1990, Pat. No. 5,174,831, and a continuation-in-part of Ser. No. 560,163, Jul. 31, 1990, Pat. No. 5,160,550, and a continuation-in-part of Ser. No. 540,193, Jun. 19, 1990, Pat. No. 5,160,794, and a continuation-in-part of Ser. No. 480,236, Feb. 15, 1990, Pat. No. 5,158,620, and a continuation-in-part of Ser. No. 363,634, Jun. 8, 1989, Pat. No. 4,925,741.

[51] Int. Cl.$^5$ .................. C22C 1/18; H01L 39/12; H01L 39/24; H01B 12/02
[52] U.S. Cl. ........................... 148/96; 29/599; 505/918; 505/921
[58] Field of Search ........... 428/660, 661, 662, 610, 428/614, 930; 505/812, 813, 814, 918, 919, 921; 148/96, 527; 29/599

[56] References Cited

U.S. PATENT DOCUMENTS

| | | | |
|---|---|---|---|
| 3,465,430 | 9/1969 | Barbar et al. | 505/918 |
| 3,534,459 | 10/1970 | Kudo et al. | 505/812 |
| 3,625,662 | 12/1971 | Roberts et al. | 505/812 |
| 3,652,967 | 3/1972 | Tanaka et al. | 29/599 |
| 3,665,595 | 5/1972 | Tanaka et al. | 29/599 |
| 3,728,165 | 4/1973 | Howlett | 148/96 |
| 4,564,564 | 1/1986 | Schuller et al. | 428/662 |
| 4,803,310 | 2/1989 | Zeitlin et al. | 29/599 |

Primary Examiner—John Zimmerman
Attorney, Agent, or Firm—Hayes, Soloway, Hennessey & Hage

[57] ABSTRACT

A Type II superconducting alloy which is superconducting at a predetermined high magnetic field is prepared by creating a composite having a periodic arrangement of at least two transition metals so as to provide numerous interfaces between the different transition metals including niobium, titanium, zirconium, vanadium, hafnium, and tantalum, and alloys thereof. The combination of transition metals is such that one of the metals will serve as a second phase when the layers are subjected to temperatures which would produce a two-phase equilibrium state from a solid solution alloy of the transition metals. The composite is mechanically reduced and heated to cause interdiffusion of the transition metals to form ductile superconducting alloy zones at the interfaces of the transition metals. Sufficient heat treatment is provided in the region where two phases exist in the phase diagram to form two phases, one phase being the desired superconducting Type II alloy and the other phase being the non-superconducting normal metal or alloy. The temperature of heat treatment is limited to the two-phase region. Thereafter, the composite is mechanically reduced so that the two zones are each less than about 1000 nm in thickness.

4 Claims, 5 Drawing Sheets

FIG.3C 0.016" THICK TITANIUM SHEET
AND 0.010" THICK NIOBIUM SHEET
ALTERNATELY STACKED.

1.81" POINT-TO-POINT

FIG. 4

Nb/Ti STACK WITH
0.010" Nb
BARRIER SHEETS 1.83"

SUPERCONDUCTOR AND PROCESS OF MANUFACTURE

This invention relates to the production of improved superconductors. This application is, in part, a continuation of the following pending applications, Ser. No. 07/628,406 filed Dec. 17, 1990, now U.S. Pat. No. 5,174,830, Ser. No. 07/586,264 filed Sep. 21, 1990, now U.S. Pat. No. 5,174,831, Ser. No. 07/560,163 filed Jul. 31, 1990, now U.S. Pat. No. 5,160,550, Ser. No. 07/540,193 filed Jun. 19, 1990, now U.S. Pat. No. 5,168,794, Ser. No. 07/480,236 filed Feb. 15, 1990, now U.S. Pat. No. 5,158,620, Ser. No. 07/363,634 filed Jun. 8, 1989, now U.S. Pat. No. 4,925,741 issued May 15, 1990. The disclosures in said applications are incorporated herein by reference.

BACKGROUND OF THE INVENTION

NbTi alloy has long served as the backbone of the superconducting wire industry. Despite continued research into alternate materials, including the recent interest in high temperature superconductors, NbTi remains the superconductor of choice. Unfortunately, high quality NbTi conductors are difficult to produce, expensive, and requiring carefully controlled alloy melting operations and complicated thermo-mechanical work schedules. Methods for simplifying these operations without adversely affecting critical superconducting properties would be of great value to the superconducting wire industry.

The conventional method for the fabrication of NbTi conductors begins with the melting of the alloy. Generally, an electrode is fabricated from pure niobium and pure titanium and is then electron beam melted. The resulting ingot is vacuum arc melted at least three times to ensure high homogeneity ($\pm 1.5$ wt % composition). This is necessary because inhomogeneous material results in poor conductor ductility and/or inferior current density ($J_c$).

The NbTi ingot is inserted into an extrusion can, which is isolated from the NbTi by a suitable diffusion barrier. Typically, the extrusion can is made of copper and the barrier is made of niobium. The barrier is required to prevent the formation of brittle Cu-Ti intermetallics during subsequent processing. Such intermetallics can cause severe mechanical problems when the later multifilament wire is being reduced to final size.

The monofilament NbTi billet is welded shut and then extruded into a rod. This material is drawn to wire, straightened, cut, and restacked into another copper extrusion can. This multifilament billet is welded shut and then hot isostatically pressed (HIP'd) to collapse the void space. Next, the billet is extruded into a rod. At this point, a series of heat treatment and cold drawing steps begins. These steps are necessary in order to obtain useful current densities in the final NbTi conductor.

As is well known in the art, high current densities are achieved only when an adequate defect structure is present in the NbTi. The defects serve to inhibit the motion of magnetic flux lines and thereby help prevent the superconductor from going normal, i.e., non-superconducting —when supporting large transport supercurrents. The defects may take any of a number of forms: grain boundaries, different phases, dislocations, or impurities. By far the most effective pinning defect in NbTi is a finely distributed secondary phase which is normal at the temperatures and magnetic fields of interest. The introduction of such a phase is the purpose behind the heat treatment of NbTi alloys.

Figure 1:
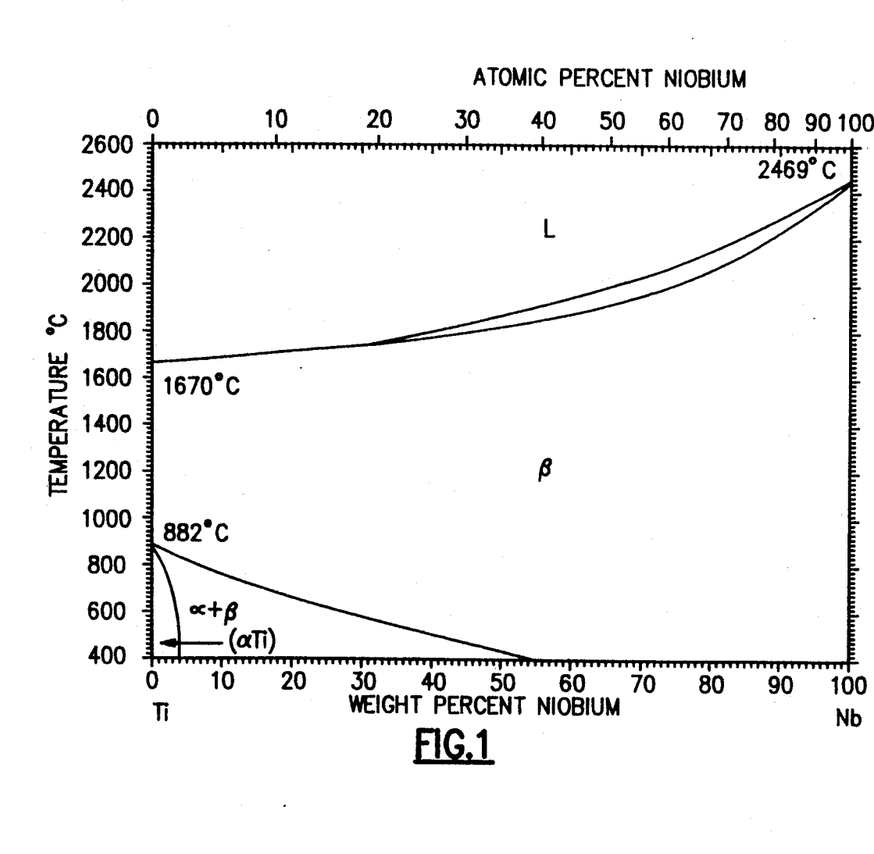
FIG. 1 is a phase diagram for the Nb-Ti alloy system. (Source: *Binary Alloy Phase Diagrams*, vol 2, pg 1702, ed. T. B. Massalski, J. L. Murray, L. H. Bennett, H. Baker, American Society for Metals, October 1986.)

After extrusion, the NbTi filaments in a conductor are essentially homogeneous single phase $\beta$ NbTi. Only the weaker defects described above are present. The benefits of normal phase pinning can only be obtained by taking advantage of the precipitation of $\alpha$ Ti from the $\beta$ NbTi alloy. As shown in the NbTi phase diagram of FIG. 1, at temperatures below 882° C., a two phase equilibrium state exists between $\alpha$ Ti and $\beta$ Nb. A Nb-55 wt. % Ti alloy, for example, when brought to equilibrium at 400° C., dissociates by eutectoid decomposition; NbTi$\rightarrow \alpha$ Ti$+\beta$ Nb, into nearly pure $\alpha$ Ti (about 96 wt % Ti) and niobium rich $\beta$ Nb phase (Nb-45% Ti) in a volume ratio of about 1:4. These phases have completely different crystallographic structures. The $\alpha$ Ti has a hexagonal close pack (HCP) structure while the $\beta$ Nb has a body center cubic (BCC) structure. Since the $\alpha$ Ti is nearly pure titanium, it can serve as a normal defect. Insofar as the initial alloy is homogeneous, the $\alpha$ Ti is distributed throughout the NbTi, usually precipitating at $\beta$ NbTi grain boundaries. For optimum pinning, the thicknesses and spacings of the $\alpha$ Ti zones must be on the order of the superconductor coherence length (about 50 A°) which can only be achieved by a substantial wire reduction after precipitation.

In practice, more than one precipitation heat treatment is required to produce optimum results in the NbTi multifilament. A typical thermo-mechanical schedule for the commonly used Nb 46.5 wt % Ti will involve three or more 300° C.–450° C. heat treatments, 40–80 hours in duration, separated by areal reductions of approximately 2.6. The final areal reduction, which reduces the accumulated $\alpha$ Ti to its optimum size and spacing, is usually in the range of 50–100. The best of the thermo-mechanical schedules for Nb 46.5 wt % Ti produces about 20 volume percent of $\alpha$ Ti in the NbTi and $J_c$'s in excess of 3000 A/mm$^2$ at 5T and 4.2K. In wires with these properties, the $\alpha$ Ti is configured in a dense array of ribbons 10–20 A° in thickness, 40–80 A° apart, and with an aspect ratio dependent upon the final strain imparted (see, for example, "Restricted Novel Heat Treatments for Obtaining High $J_c$ in Nb 46.5 wt % Ti", P. J. Lee, J. C. McKinnell, and D. C. Larbalestier, *Advances in Cryogenic Engineering (Materials)*, vol. 36A, pp. 387–294, Ed. R. P. Reed and F. R. Fickett, Plenum Press, New York, 1990).

While it is necessary to apply heat treatments in order to precipitate $\alpha$ Ti and obtain high current density, these heat treatments also create mechanical problems. The presence of $\alpha$ Ti greatly reduces the ductility of the NbTi. At the same time, the heat treatments result in titanium diffusion into the niobium barrier around the NbTi and out to the copper matrix. Brittle Cu-Ti intermetallics can then form. Both the reduced ductility and the Cu-Ti formation cause filament deformation, called "sausaging", wire breakage, and degraded superconductor performance. The diffusion through the barrier also causes titanium depletion in the NbTi, contributing to depressed superconducting properties.

The present invention eliminates these problems and the need for any precipitation heat treatments. In essence, the present invention is the exact opposite of the conventional NbTi processing route. Instead of fabricating the NbTi alloy and then precipitating the necessary amount of nearly pure titanium the present invention begins with pure niobium and pure titanium and then combines the two to form two metallurgically separate and distinct phases which can co-exist in equilibrium at a given temperature. Only a brief equilibrium heat treatment may then be required to fix the $\alpha$ Ti and $\beta$ Nb phases and to create a structure identical to that of a conventionally processed alloy.

In the preferred embodiment of the invention pure niobium and pure titanium sheets having a thickness ratio of about 1:2 are layered alternately within a ductile extrusion can. This composite is then reduced via standard extrusion and wire fabrication techniques to a size at which each pair of Nb+Ti is about 2 $\mu$m in thickness. In the course of bringing the material to this size, sufficient temperature and times are employed to cause the niobium and titanium to alloy. At the 2 $\mu$m layer thickness, a separate heat treatment may be applied in order to bring the partially diffused structure to a uniform $\alpha$ Ti and $\beta$ Nb equilibrium concentration at the specified temperature. After the heat treatment, the composite is reduced in size to the point where each Nb+Ti pair is about 100 nm in thickness, so that optimum flux pinning is obtained. The fine structure within this product is indistinguishable from a comparable alloy that has been subjected to multiple heat treatments.

Because the process of the present invention does not involve the extensive precipitation heat treatments of the conventional fabrication route, titanium diffusion through filament barriers does not occur. Sausaging and depressed superconducting properties are therefore not a problem. Although one might expect that the presence of pure titanium might cause ductility problems, much as $\alpha$ Ti does in the conventional alloy, no such problems arise so long as the interstitial content of the pure titanium is not too high. In particular, if the oxygen content is kept below about 1000 ppm, composite ductility is excellent. It is believed that this is due to the fact that the titanium is in all cases adjacent to niobium. Since processing is performed at high temperature, the niobium, with less than 100 ppm of oxygen, is able to getter much of the oxygen from the titanium, thereby improving its deformability. By eliminating poor ductility, filament sausaging, and titanium depletion, the present invention greatly improves upon the current methods for the fabrication of fine filament NbTi superconductors.

Other researchers, intent upon obtaining improved superconductor performance, have developed composites superficially similar to those of the present invention. In U.S. Pat. No. 3,625,662, Roberts et al. describe a method for fabricating superconductors through the diffusion of pure metal layers. The product of Roberts '662 is entirely different from that of the present invention in that the claimed improvement is obtained by maximizing the surface-to-volume ratio of the superconductor, not by creating a structure which is the same as that of a heat treated alloy. In fact, in FIG. 2a of Robert's '662 patent he shows a distinct region of unreacted pure niobium and pure zirconium remaining after diffusion has taken place. He also indicates that Nb-Zr and Nb-Ti are solid solution alloys and that for Nb-Zr, diffusion should take place at temperature as high as 1800° F. (982° C.). The allotropic $\alpha$ to $\beta$ phase transformation for pure zirconium occurs at 862° C. The temperature of 1800° F. would be well above the two phase region and separate phases can not exist in this region. Roberts '662 in no way recognized the need for pinning regions and does not mention the two phase structure at all that is central to the present invention.

In U.S. Pat. No. 4,803,310, Zeitlin et al. describe a method by which to fabricate a superconducting composite consisting of superconducting alloy filaments embedded in a continuous, non-random network of normal pinning material. The normal layers are designated so that when the material is brought to the proper size, the layers have a thickness and spacing that match the flux line lattice (FLL) at some predetermined temperature and applied magnetic field. Maximum flux pinning is claimed to result. Although the result of the process is a two-phase structure, Zeitlin '310 teaches that the normal component should be "one that will not diffuse, or will diffuse only nominally into the core filaments" (column 2, lines 47-48). The inventors thus ensure the two-phase structure by preventing diffusion. Indeed, for the example of manufacture, any significant interdiffusion between the niobium and NbTi would be expected to degrade the superconducting properties by shifting the NbTi composition to higher niobium content and by undermining the two-phase structure. This effect has been confirmed experimentally ("Further Developments in NbTi Superconductors with Artificial Pinning Centers", H. C. Kanithi, P. Valaris, L. R. Motowidlo, and B. A. Zeitlin, To Be Published, Presented as paper no. DX-4(C), ICMC/CEC, Huntsville, Ala., June 1991). In contrast, the present invention requires diffusion to produce the $\alpha+\beta$ structure.

BRIEF DESCRIPTION OF THE INVENTION

The essential elements of a preferred form of the invention comprise the following steps:

1. Creating a composite characterized by a periodic arrangement of at least two transition metals so as to provide numerous interfaces between the different transition metals. The transition metals are selected from the elements niobium, titanium, zirconium, vanadium, hafnium, and tantalum. The combination of transition metals is such that one of the metals will serve as a second phase when the layers are subjected to temperatures which would produce a two-phase equilibrium state from a solid solution alloy of said transition metals.

2. Mechanically reducing and heating the composite to cause interdiffusion of the transition metals to form ductile superconducting alloy zones at the interfaces of the transition metals.

3. Providing, during the processing, sufficient heat treatment in the region where two phases coexist in the phase diagram, one phase being the desired high field superconducting Type II alloy and the other phase being the non-superconducting normal metal or alloy, and limiting the temperature of heat treatment to the two-phase region.

4. Reduction of the composite to a size at which each transition metal set is less than 1000 nm, preferably, approximately 100 nm in cross-sectional thickness, as extrapolated from the original transition metal components. Optimum flux pinning is achieved for layer thicknesses of this size.

The above processing steps result in a superconductor having a microstructure indistinguishable from a comparable alloy from which a second phase has been precipitated by extensive thermo-mechanical working.

BRIEF DESCRIPTION OF THE DRAWINGS

In order to more fully understand the invention, reference should be had to the following detailed description taken in conjunction with the attached drawings, wherein.

DETAILED DESCRIPTION OF THE INVENTION

The present invention applies to Type II superconducting alloys in which flux pinning is achieved through the development of a two-phase structure, the primary phase being superconductive, the secondary phase being normal or weakly superconducting at the temperatures and magnetic fields of interest. The exemplar is the NbTi superconducting alloy. The phases that form under the two-phase equilibrium are denoted by the letters $\alpha$ Ti and $\beta$ Nb. As can be seen in the phase diagram, $\alpha$ Ti is almost pure titanium, with no more than about 4 wt. % Nb solubility. This material is normal at standard operating temperatures and magnetic fields. The $\beta$ Nb phase is a solid solution of niobium and titanium. The critical superconducting properties ($T_c$, $H_{c2}$) of this phase vary depending upon the composition, the best properties being observed for compositions between about 40 wt. % Nb and 70 wt. % Nb (30-60 wt. % Ti).

The present invention approaches the two-phase equilibrium from the opposite direction. Rather than beginning near the center of the phase diagram with a single homogeneous solid solution, we begin at the extremes of pure niobium and pure titanium. We then move inward toward the equilibrium state rather than outward. The position of the equilibrium is determined by the applied equilibrium temperature and the average composition, just as for the alloy, but the process is not one of precipitation, but alloying. In this sense, it is additive rather than subtractive.

Figure 2:
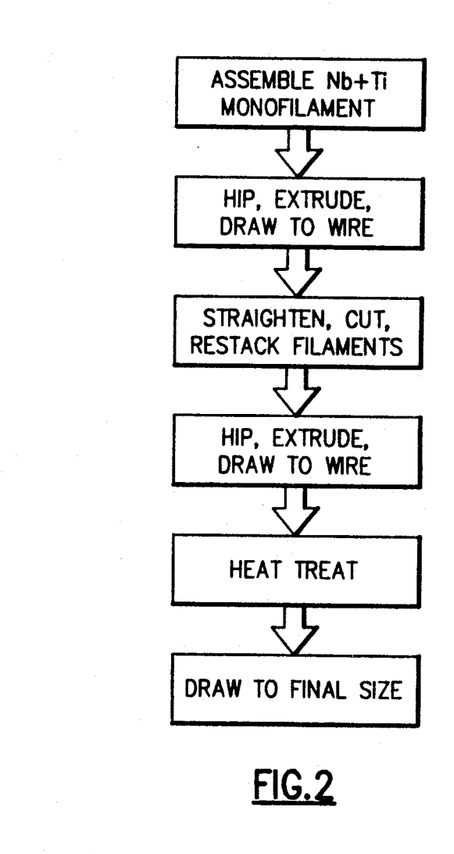
FIG. 2 is a diagram showing the basic processing route for the present invention.
Figure 3A:
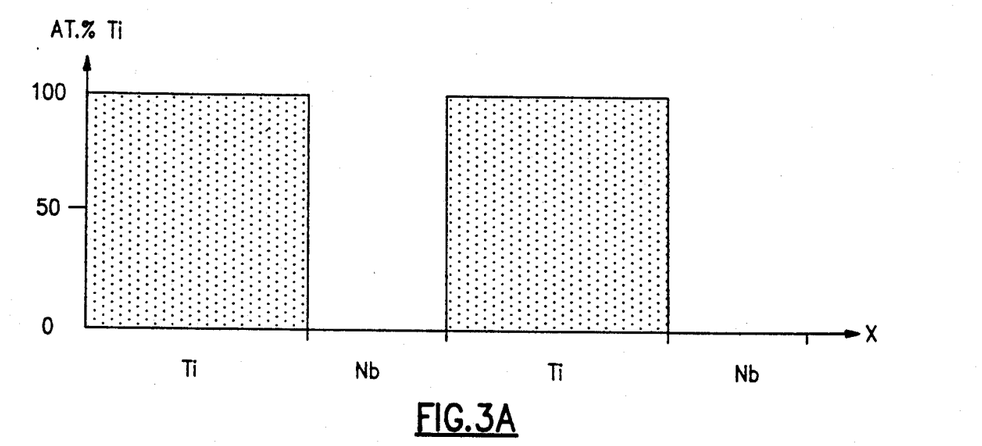
FIGS. 3a, 3b and 3c are diagrams showing how diffusion and heat treatment affect the Nb/Ti layers of the present invention. A) after the monofilament extrusion. B) After the multifilament extrusion. C) After the equilibrium heat treatment.

The basic processing route for the present invention is shown in FIG. 2, for the case of niobium and titanium. First, the Nb+Ti monofilament is assembled. In the preferred form of the present invention, the composite contains alternating sheets of niobium and titanium, although other geometries, such as titanium filaments in a niobium matrix, are also possible. The ratio of Nb:Ti is chosen so that the average composition corresponds to the optimum properties of the alloy (e.g., Nb 46.5 wt. % Ti). This monofilament is sealed and then HIP'd and extruded at a temperature of 650° C. The state of the layers after this extrusion is shown schematically in FIG. 3A, which represents niobium and titanium layers in a ratio of 1:1.6 by volume, Nb 46.2 wt. % Ti average composition. Relatively little diffusion has occurred.

The monofilament is drawn to a size at which the Nb+Ti layer thickness is about 10 $\mu$m. The monofilament is straightened, cut to length, and then restacked into a secondary billet. This billet is sealed, HIP'd, and extruded, the HIP and extrusion temperatures again being about 650° C. The condition of the layers after this extrusion is shown schematically in FIG. 3B. It is important to note the reduction in the thickness of the titanium layers as compared with FIG. 3A. Through diffusion, much of the titanium has been driven into solution with the Nb, leaving only relatively small regions of pure titanium, or nearly pure titanium, which becomes true $\alpha$ Ti when brought to the two phase equilibrium (see FIG. 3C). That the titanium layers grow narrower during processing emphasizes the fundamental difference between the present invention and conventional NbTi, where heat treatment results in the precipitation and growth of $\alpha$ Ti sites.

The multifilament extrusion is cold drawn to a size at which the (extrapolated) Nb+Ti layer thickness is about 2 $\mu$m. A single heat treatment can then be preferably applied in order to bring the structure into equilibrium. A typical heat treatment would be 375° C. for 40 hours. The result of such a heat treatment is a structure like that shown schematically in FIG. 3C: a $\beta$ Nb phase in equilibrium with $\alpha$ Ti, precisely the same result as can be obtained in the alloy only through extensive precipitation heat treatments. When the composite is reduced to the point where the (extrapolated) Nb+Ti layer thickness is about 100 nm, maximum current density is observed.

The primary advantage of the present invention is clear from FIG. 3. At no time is it necessary to precipitate $\alpha$ Ti, because the titanium initially built into the composite serves as the $\alpha$ Ti. Since it is present in every Nb+Ti layer, the amount and uniform distribution is guaranteed, unlike in the alloy, where inhomogeneities can adversely affect local precipitation.

Figure 3B:
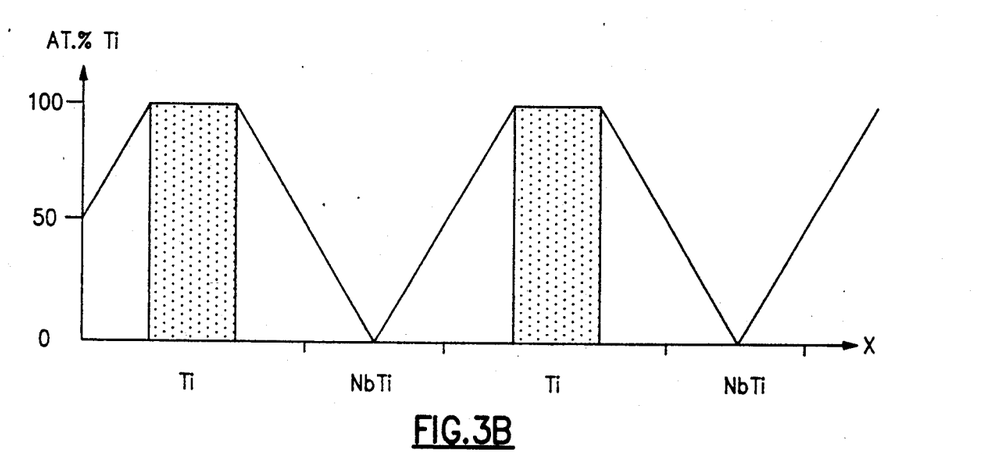
Figure 3C:
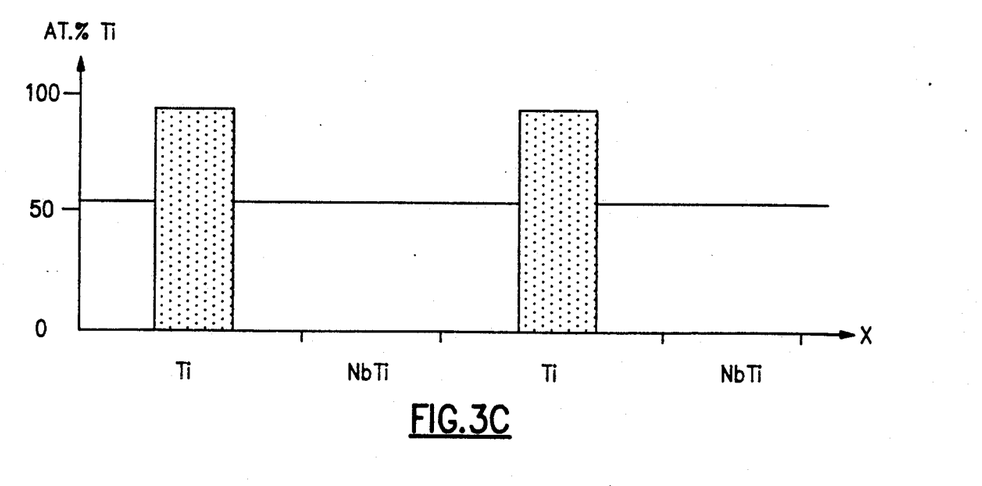

FIG. 3B reflects the most critical stage of the process of the present invention: the secondary billet processing. Excessive diffusion must not be allowed to occur at this point or pinning sites will be lost. In the extreme case, the composite becomes a homogeneous single phase alloy. Insofar as the present invention demands that normal regions be maintained along with superconducting regions, such a situation is unacceptable. For this reason, the composite layer thickness at restack must be coordinated with the billet processing temperatures and times so as to prevent homogenization. Insufficient diffusion is not desirable either, partly because the oxygen gettering effect described earlier may not be sufficient to allow composite reduction, and partly because more extensive equilibrium heat treatment would be required in order to achieve the $\alpha + \beta$ structure of FIG. 3C. It is very important that the processing conditions provide a middle ground between the extremes of no diffusion and too much diffusion.

To determine the best processing conditions, one must work backwards from the equilibrium state that is to be achieved. By applying the well known lever rule to the phase diagram at the given equilibrium conditions, one can find the necessary volume percentages for each of the two phases. From this fact and the given Nb+Ti layer thickness at restack, one can derive the required thickness of the first phase (diffusion zone) and second phase (pure zone) at the restack size. In theory, from a knowledge of the diffusion characteristics of the constituent pure metals, one can then calculate the processing times and temperatures needed in order to achieve the proper diffusion zone thickness. In practice, factors like cooling rates and extrusion reductions confuse the issue, usually making it necessary to determine the conditions for optimum superconductor performance through experimentation.

Also important is the size at which the heat treatment is applied. As for the alloy, the product of the present invention is sensitive to strain. Hence, if the equilibrium heat treatment is applied at too small a wire size, inferior current density is likely to result.

In practice the single equilibrium heat treatment may not even be required. For example, if the temperatures of hot processing are kept well within the two phase region, such as between 800° C. to 400° C., phase separation can be maintained as it does when the extruded composite is cooled to room temperature. The optimum condition would be where the composite is isothermally processed within the heat treat temperatures of 500° C. to 350° C. The lower temperatures, however, would require greater extrusion pressures and, more importantly, would significantly reduce the rate of diffusion of the niobium and titanium. A processing route which excludes the final equilibrium heat treatment is nonetheless also within the scope of the invention. Although less than optimum pinning is achieved in the absence of final heat treatment the performance attainable is substantial nonetheless.

In accordance with the present invention, a NbTi composite superconductor has been fabricated as described in the following non-limiting example.

Figure 4:
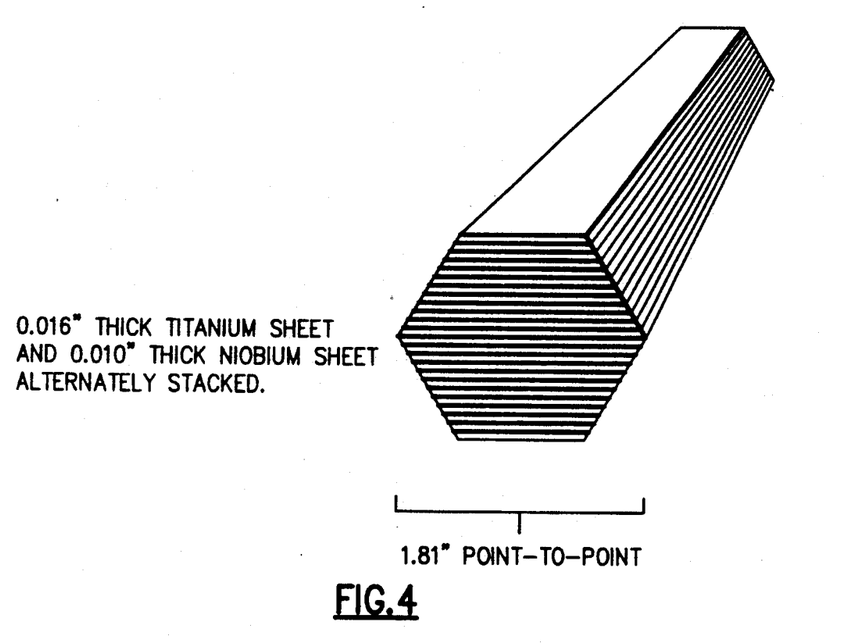
FIG. 4 is a schematic diagram of niobium and titanium sheets stacked alternately to form a hexagonal cross-section.

EXAMPLE I 0.016" thick titanium sheets and 0.010" thick niobium sheets were alternately stacked in the hexagonal configuration shown in FIG. 4. The hexagonal shape was chosen in order to minimize void space in the later restack billet. A total of 59 titanium sheets and 58 niobium sheets, all 6.00" long, were used in the stack. The sheet arrangement was such that titanium sheet was at the top, bottom, and center of the stack.

Figure 5:
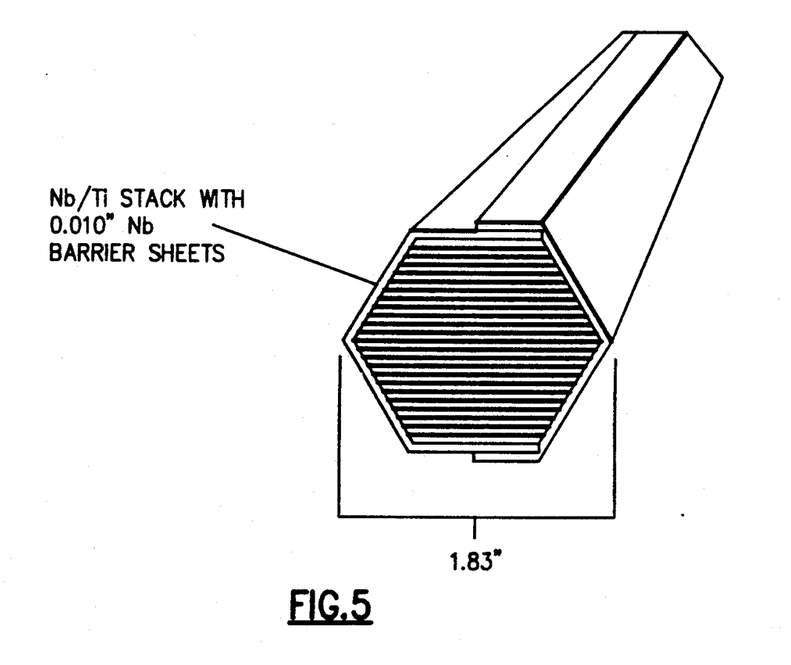
FIG. 5 is a schematic diagram of the stack of FIG. 4 surrounded by a niobium diffusion barrier.

A two piece diffusion barrier made of 0.010" thick niobium sheet was wrapped around the hexagonal stack as shown in FIG. 5. This assembly was inserted into a copper extrusion can having a 1.60" internal diameter and a 2.50" external diameter. The void space at the sides of the hexagonal stack was filled with copper rods. All components were cleaned prior to assembly.

A copper nose and tail were attached to the monofilament can via electron beam welding in vacuum. The billet was then HIP'd and 650° C., 15 ksi. for 4 hours in order to eliminate the remaining void space. The HIP'd billet was machined to 2.00" in diameter in order to fit a 2.125" diameter extrusion liner. The billet was heated for 2 hours at 650° C. and was then extruded at temperature to 0.512" diameter. The ram speed was 15 ipm. The rod was water quenched immediately after extrusion.

The monofilament extrusion was cropped to remove the excess copper at the nose and tail and was then cold drawn at an areal reduction rate of 20% per die pass to a final diameter of 0.030". The extrapolated Nb+Ti layer thickness as 9.9 $\mu$m at this wire size. The wire was straightened and then cut into 4.75" lengths. The copper was removed from the filaments in a solution of 50% water and 50% nitric acid. The resulting hexagonal filaments were stacked into a copper can having an internal diameter of 1.75" and an external diameter of 2.50". The can was lined with a 0.010" thick niobium diffusion barrier prior to insertion of the filaments. Approximately 4000 filaments were fitted into the can. This secondary billet was then welded shut, HIP'd, machined, and extruded exactly as was the monofilament, except that the diameter of the extruded rod was 0.625".

Figure 7:
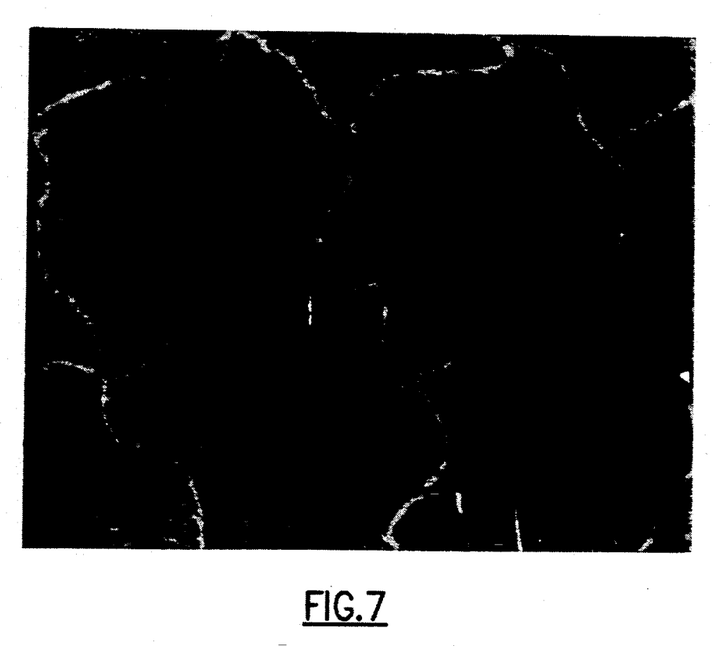
FIG. 7 is a micrograph of the extruded multifilament composite rod of Example I at 0.625" in diameter. (200X)

By examining FIG. 7, which is a micrograph of the composite rod at this point 0.625" diam) in the processing, the familiar structure of the composite is clearly visible. This is believed to be composed largely of NbTi layers separated by $\alpha$ Ti or pure Ti layers. This metallurgical combination results from the extended (approximately 12 hours total) heat treatments at 650° C. during the HIP and extrusion steps. As can be seen from FIG. 1, this 650° C. temperature is well within the temperature range for the two phases ($\alpha$ and $\beta$) to form.

After the secondary extrusion was cropped, a section of the material was cold drawn at an areal reduction rate of 20% per die pass to three diameters: 0.385", 0.232", and 0.147". These wire sizes corresponded to extrapolated Nb+Ti layer thicknesses of 1.91 $\mu$m, 1.15 $\mu$m, and 0.73 $\mu$m, respectively. This material was subjected to a 375° C., 36.5 hour heat treatment and was then cold drawn along the standard 20% line to 0.0240" in diameter, where the extrapolated Nb+Ti layer thickness was 119 nm and flux pinning was expected to be near maximum. Of the three materials, the one that was heat treated at 0.385" gave the best results when tested for critical current density at a temperature of 4.2K. The following data were collected for this wire:

| Field (T) | Non-copper $J_c$ (A/mm$^2$) |
|---|---|
| 3 | 6000 |
| 5 | 3455 |
| 7 | 1510 |
| 9 | 211.0 |

Figure 6:
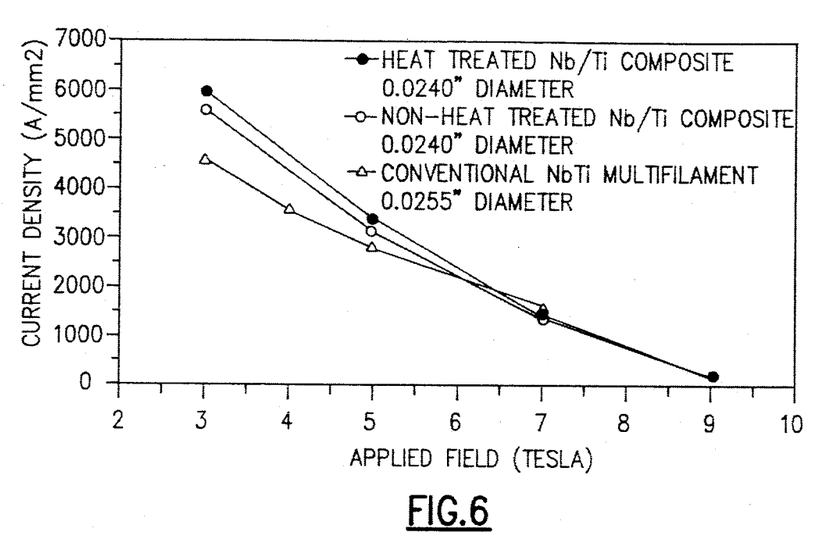
FIG. 6 is a plot of current density versus applied magnetic field for two composite wires fabricated in accordance with the present invention and a conventionally processed multifilament NbTi wire.

These data points are plotted in FIG. 6, along with data for the product of Example II, below, and for a typical, conventionally processed NbTi multifilamentary wire. The latter wire was designed for use in magnets for the Superconducting Supercollider. As the plot shows, the product of the present invention is superior to conventional material for all applied magnetic fields below 7T.

It is not strictly necessary to apply the final equilibrium heat treatments in the process of the present invention. The following non-limiting example describes a composite fabricated in accordance with the invention, but which did not undergo equilibrium heat treatment.

EXAMPLE II

A section of the secondary extrusion of Example I was cold drawn along a standard 20% die line to 0.0240" in diameter. The material did not undergo any intermediate equilibrium heat treatments. The 4.2K current densities obtained were as follows:

| Field (T) | Non-copper $J_c$ (A/mm$^2$) |
|---|---|
| 3 | 5605 |
| 5 | 3231 |
| 7 | 1418 |
| 9 | 237.4 |

The heat treated material of Example I was superior at all fields except 9T, where it was only slightly inferior. It is believed that the lower 9T value is caused by the lesser amount of cold work imparted in drawing from the 0.385" heat treatment diameter. Although the non-heat treated material performed less well than the heat treated material, it still performed better than conventionally processed material at fields below 9T, as can be seen in the plot of FIG. 6.

Figure 8:
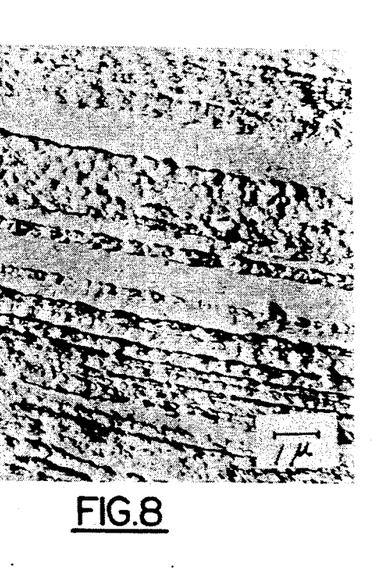
FIG. 8 is from the paper "Critical Currents of Superconducting Nb-Zr-Ti Alloys in High Magnetic Fields" by T. Doi, F. Ishida, U. Kawabe and M. Kitada, AIME transactions, Vol 242, September 1968, pages 1793-1800.
Figure 9A:
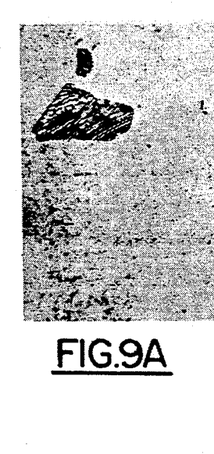
FIGS. 9a, 9b and 9c are FIG. 164, page 221 from "Principles of Physical Metallurgy" by Doan and Mahia, McGraw-Hill, 1941.
Figure 9B:
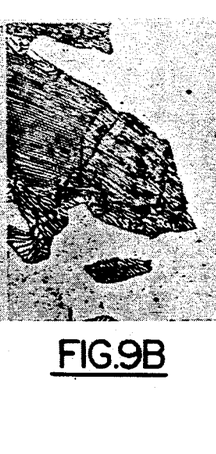
Figure 9C:
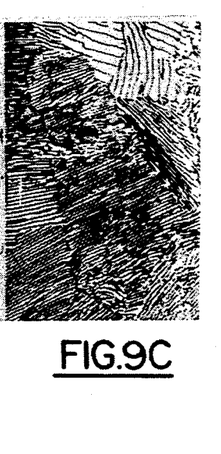

The above discussion has focused on the NbTi alloy system primarily because that is the most commonly used superconductor in the industry today. Those knowledgeable in the art will realize that the invention could be applied with equal success to other alloy systems. Any Type II superconducting alloy in which flux pinning can be achieved through precipitation of a second phase is suitable for the application of the present invention. For example, a Nb-Zr-Ti composite could be fabricated from layers of pure niobium, zirconium, and titanium. The result would be very similar to the two phase structure obtained through heat treatment of the true alloy. Such a structure is described in a paper entitled "Critical Currents of Superconducting Nb-Zr-Ti Alloys in High Magnetic Fields" by T. Doi, F. Ishida, U. Kawabe, and M. Kitada, *AIME Transactions* Vol. 242, pp. 1793-1800, September '68. In this case, the alloy was Nb 5% Zr 60% Ti (i.e., atomic percent). The micrograph of FIG. 8, which is from this work, shows the lamellar pearlitic structure obtained in this alloy after homogenization at 1100° C. for five hours and a subsequent heat treatment of 500° C. for one hour. Note the similarity between this structure and the product of Example I, shown in FIG. 7. FIG. 9 shows the two phase pearlitic structure that can be obtained through the eutectoid decomposition of γ austenite in low carbon steel: γ (austenite)→α (ferrite) +Fe$_3$C (cementite). Again, it is remarkably similar to the product of the present invention as shown in FIG. 7. While the case of low carbon steel does not involve superconductivity, it serves to emphasize the importance of such structures in nature, structures that now can be duplicated through the application of the invention.

The present invention allows superconducting wire manufacturers to control microstructural factors that are difficult, if not impossible, to control through conventional processing techniques. For NbTi, the chief factors are:

1. The thickness of α Ti ribbons.
2. The spacing of α Ti ribbons.
3. The amount of α Ti.
4. The composition of the β Nb phase.

Through the appropriate choice of starting materials and the use of a thermo-mechanical working schedule informed by the phase diagram, these factors can be manipulated to produce two phase structures having the desired properties. No complicated melting operations or heat treatment schedules are required. Clearly, in terms of flexibility, economics, and fabricability, the benefits of the present invention are potentially enormous.

I claim:

1. The process of producing a Type II superconducting alloy which is superconducting at a high magnetic field, comprising the steps of creating a composite characterized by a periodic arrangement of at least two transition metals so as to provide numerous interfaces between the different transition metals, the transition metals being selected from the elements niobium, titanium, zirconium, vanadium, hafnium, and tantalum, and alloys thereof which are not superconducting at said field, the combination of transition metals being such that one of the metals will serve as a second phase when the layers are subjected to temperatures which would produce a two-phase equilibrium state from a solid solution alloy of said transition metals, mechanically reducing and heating the composite to cause interdiffusion of the transition metals to form ductile superconducting alloy zones at the interfaces of the transition metals, there being sufficient heat treatment in the region where two phases exist in the phase diagram to form two phases, one phase being the desired superconducting Type II alloy and the other phase being the non superconducting normal metal or alloy, limiting the temperature of heat treatment to the two-phase region, and thereafter mechanically reducing the composite so that the two zones are each less than about 1000 nm in thickness.

2. The process of claim 1 wherein the composite is subjected to a second heat treatment in the two phase region when the zones have been reduced to a thickness less than about 10 μm.

3. The process of claim 1 wherein the transition metals are niobium and titanium.

4. The process of claim 1 wherein the Type II superconductor is a ternary alloy.

* * * * *